United States Patent [19]

Moufah

[11] 4,107,549
[45] Aug. 15, 1978

[54] TERNARY LOGIC CIRCUITS WITH CMOS INTEGRATED CIRCUITS

[76] Inventor: Hussein T. Moufah, 3480 Havenwood Dr., Apt. 203, Mississauga, Ontario, Canada

[21] Appl. No.: 795,441

[22] Filed: May 10, 1977

[51] Int. Cl.² .............. H03K 19/08; H03K 19/20; G11C 11/40; H03K 3/353
[52] U.S. Cl. .................. 307/205; 307/207; 307/209; 307/214; 307/218; 307/238; 307/279
[58] Field of Search ............ 307/205, 207, 209, 214, 307/215, 238, 279, 291

[56] References Cited

U.S. PATENT DOCUMENTS

| | | | |
|---|---|---|---|
| 3,356,858 | 12/1967 | Wanlass | 307/205 |
| 3,492,496 | 1/1970 | Callan | 307/209 |
| 3,609,411 | 9/1971 | Ma et al. | 307/205 X |
| 3,641,511 | 2/1972 | Cricchi et al. | 307/215 X |
| 3,845,328 | 10/1974 | Hollingsworth | 307/209 X |
| 3,911,289 | 10/1975 | Takemoto | 307/205 |
| 3,942,043 | 3/1976 | Sirocka et al. | 307/279 |
| 4,042,841 | 8/1977 | Hills et al. | 307/215 X |
| 4,050,064 | 9/1977 | Hashimoto et al. | 340/324 M |

OTHER PUBLICATIONS

Lupic, "Ternary Threshold Circuit;" *IBM Tech. Discl. Bull.*; vol. 13, No. 11, pp. 3479; Apr. 1971.
Hollingsworth, "Memory Cell;" *RCA Technical Notes*, (pub.); TN No. 1125, 2 pps.; Aug. 18, 1975.
Huertas et al., *Electronic Letters*, (pub.); pp. 385-386; vol. 12, No. 15, Jul. 22, 1976.
Grimes, "Ternary CMOS Logic Device;" *IBM Tech. Discl. Bull.*; vol. 17, No. 4, pp. 1145-1146; Sep. 1974.

*Primary Examiner*—Larry N. Anagnos
*Attorney, Agent, or Firm*—Donald E. Hewson

[57] ABSTRACT

Ternary storage elements are realized using ternary operators and fundamental circuits, designed to make practical use of CMOS (or COS/MOS) integrated circuits. Word-organized and trit-organized memory cells are designed for the construction of a ternary random-access-memory array (TRAM). Several flip-flops (tri-flops) are constructed and described in detail, including a PZN (set positive, set zero and set negative), a clocked PZN, a D-type and a T-type. Ternary shift registers and ring counters are formed by means of these tri-flops. A master-slave T-type tri-flop is used for the construction of a ternary up counter which is able to count from 0 to $3^n$ using the normal ternary code or from $-(3^n-1)/2$ to $+(3^n-1)/2$ when the signed-ternary code is employed. With a little modification, a ternary down counter may also be constructed. A divide-by-M ternary counter which can be programmed is described. A ternary decoder and encoder are presented, which are the elements of a complete ternary read-only-memory (TROM). A modified ternary inverter (MTI) is taken as a unit cell of a ternary memory matrix.

12 Claims, 21 Drawing Figures fig.1.

TERNARY LOGIC CIRCUITS WITH CMOS INTEGRATED CIRCUITS

FIELD OF THE INVENTION

This invention relates to three-valued logic, and particularly relates to the provision of practical three-valued logic operators which may be realized using complementary metal oxide semiconductor integrated circuits so as to provide a practical means of high rate, high density digital processing.

BACKGROUND OF THE INVENTION

In 1921, E. L. Post in the American Journal of Mathematics, in a paper entitled "Introduction to a General Theory of Elementary Propositions" proposed an n-valued logic as a generalization of the algebra of elementary propositions. Since then considerable work has proceeded with the synthesis of n-valued switching circuits.

Considerable advantages may be gained by considering systems of a radix higher than 2 and built from multiple-valued elements. They may show increased speed of arithmetic operation because of the smaller number of digits required for a given accuracy, assuming that multiple-valued logic elements can operate at a speed approaching that of the corresponding binary logic elements. They can permit a better utilization of transmission channels because of the higher information content carried by each line. They have more efficient error detection and correction codes. They possess higher density of information storage. They offer some reduction of wiring complexity which is an important factor in the area of integrated circuit technology.

Three-valued logic, which is a special case of the multiple-valued logic, has an attractive interest since the classical calculus shows that the most efficient representation of numbers is with the base $e(2.71828...)$, and 3 is the nearest integer to it. Moereover, in digital-computer process control the required outputs are basically ternary, e.g. for a digital shaft servo three commands are needed: No error, remain in position; anti-clockwise error, rotate clockwise; and clockwise error, rotate anticlockwise.

Due to some properties of Complementary-Symmetry Metal Oxide Semiconductor Devices, known as CMOS (or COS/MOS) integrated circuits, one may use them in the design of ternary logic circuits, of course in a way which differs somewhat from normal binary logic circuit designs. Two resistors are inserted between two channel transistors of complementary type. The added resistors permit one to obtain three equiprobable stable voltage levels when two power supplies are used to ensure proper biasing. One of the power supplies is positive and is applied to the source of the p-channel transistor $(V_{DD} = V)$, and the second one is negative, with value $V_{SS} = -|V_{DD}| = -V$ applied to the source of the n-channel transistor. The three voltage levels are then equal to V, zero potential and $-V$. Based on this idea the ternary inverters, NAND and NOR are realized with the CMOS integrated circuits.

With the advancing electronic technology, interest in multi-valued logic, and especially in the ternary one, has grown rapidly. Much work has been done on ternary combinational logic circuits, but few studies have been centered on the design of ternary sequential circuits. This may be attributed to the lack of suitable ternary memory elements. The use of integrated circuits in designing ternary memory elements may be a good solution to this problem.

Because of some properties of CMOS (or COS/MOS) devices, they may be used in the design of ternary logic circuits, in a manner which differs somewhat from the design of normal or ordinary binary logic circuits. Therefore, according to this invention, ternary memory circuits are designed using CMOS (or COS/MOS) integrated circuits; and this is accomplished by means of ternary operators and fundamental circuits. Several ternary sequential circuits and memory matrix operators are then constructed using the basic ternary logic operators and memory elements of this invention.

All of the circuits presented herein have been realized using CD4007AE and Quad Bilateral Switch CD4016AE RCA COS/MOS integrated circuits. The first chip comprises three p-channel and three n-channel enhancement-type MOS transistors; and the second chip comprises four independent bilateral signal switches, each of which consists of a p-channel and an n-channel device.

BRIEF SUMMARY OF THE INVENTION

A principal object of this invention is to provide simple ternary logic operators and circuits, based on present day, practical complementary symmetry metal oxide semiconductors.

It follows that this invention provides a variety of ternary sequential circuits which have arithmetic capabilities.

It also follows that memory matrix arrays may be constructed using the simple ternary logic elements according to this invention.

Another object of this invention is, therefore, to provide sufficient ternary logic operators and fundamental circuits as to provide practical, three-valued inverters—simple, positive or negative—NOR (or OR) and NAND (or AND) gates, as well as AND-OR-INVERT (AOI) gates. From these elements, a basic ternary storage element may be provided, which are either word-organized or trit-organized, from which random-access-memory arrays may be constructed; and using ternary logic encoders and decoders, a read-only-memory may be provided.

BRIEF DESCRIPTION OF THE DRAWINGS

These and other features and objects of the invention, and exemplary operating circuits embodying the principles of the present invention, are discussed in greater detail hereafter, in association with the accompanying drawings, in which:

FIGS. 7 to 20 show practical operating circuits embodying the basic ternary logic elements of this invention, including, respectively:

a word-organized ternary storage cell
a PZN tri-flop
a clocked PZN tri-flop
a D-type tri-flop
a master-slave D-type tri-flop
cycling and inverse cycling gates a master-slave T-type tri-flop with P, Z and N capabilities
a two-stage COS/MOS dynamic ternary shift register
a COS/MOS ternary counter
a $J_k$ gate
a divide-by-M ternary counter
a ternary decoder
a COS/MOS ternary ROM encoder
a T gate

DESCRIPTION OF THE PREFERRED EMBODIMENTS

Figures 1, 2, 3, 4:
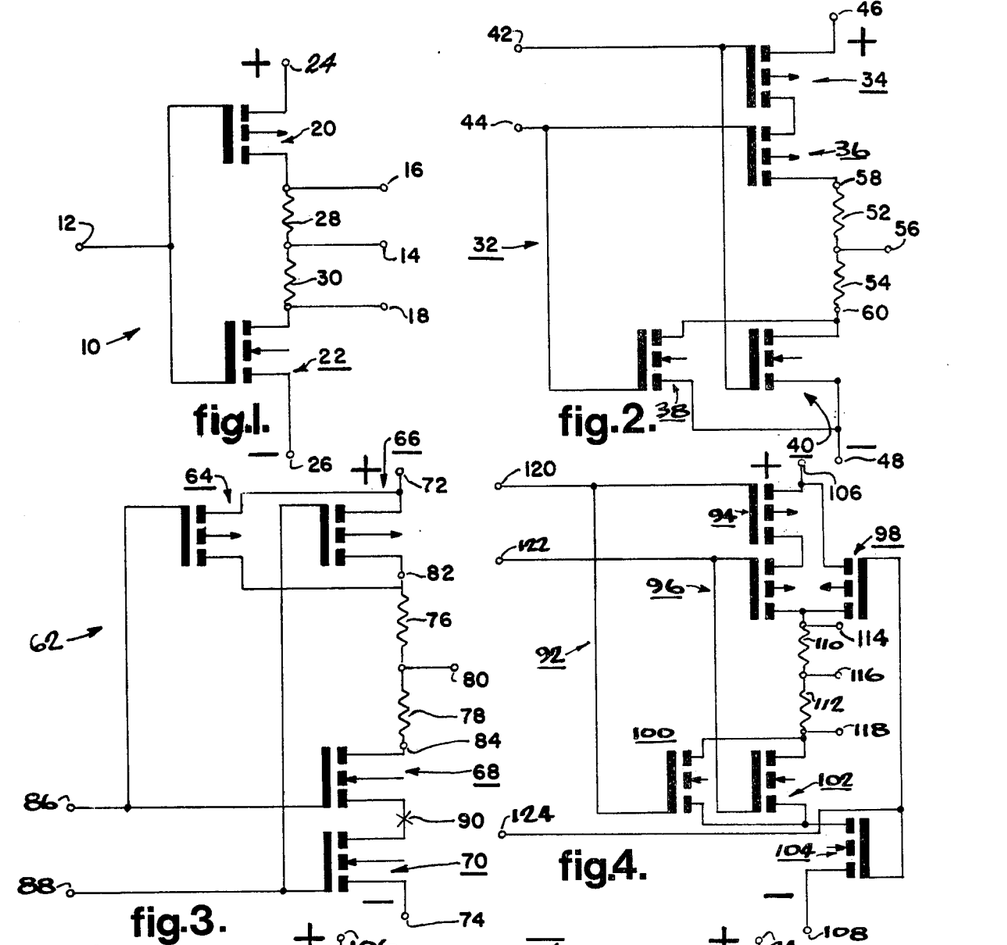
FIG. 1 is the circuit of a basic ternary inverter.
FIG. 2 shows a basic ternary NOR circuit.
FIG. 3 shows a basic ternary NAND circuit.
FIGS. 4 and 5 show alternative arrangements for a ternary AND-OR-INVERT gate.

Ternary Operators and Fundamental Circuits—Referring to FIG. 1, there is shown a fundamental ternary inverter 10 which is a three-valued logic operator and which may be operable with an input at any one of three voltage levels which are $-V$, zero potential of V; or which are otherwise respectively referred to as levels 0, 1 and 2. Thus, an input at level 0, as referred to later in this description and as set out in truth tables, is a negative voltage; an input signal at level 1 is zero voltage and an input signal at level 2 is a positive voltage.

In any event, the ternary inverter 10 of FIG. 1 has an input 12 and output terminals 14, 16 and 18. The output terminal 14 is the output of a simple ternary inverter; whereas an output at terminal 16 is an output of a positive ternary inverter, and likewise an output at terminal 18 is an output of a negative ternary inverter. The three ternary basic operators, therefore, are a simple ternary inverter (STI), a positive ternary inverter (PTI), and a negative ternary inverter (NTI), and they are considered in Table I below:

| x | $\overline{x^2}$ | $\overline{x^1}$ | $\overline{x^0}$ |
|---|---|---|---|
| 2 | 0 | 0 | 0 |
| 1 | 2 | 1 | 0 |
| 0 | 2 | 2 | 2 |

The ternary operator 10 of FIG. 1 comprises a pair of complementary p-type and n-type metal oxide semiconductor devices 20 and 22, respectively. The sources and substrates of the complementary metal oxide semiconductor devices are connected, respectively, to a positive power supply 24 and a negative power supply 26. The drains of the respective p-type and n-type MOS devices 20 and 22 are each connected to one of a pair of equal-valued resistors 28 and 30, with a common connection between the resistors 28 and 30. It will be noted that output 14 is connected to the common connection between the equal-valued resistors 28 and 30, and the output terminal 16 and 18 are respectively connected to the drains of the p-type MOS transistor 20 and the n-type MOS transistor 22.

Typical values for the positive and negative power supplies are +4 volts and −4 volts, respectively; and typical values for the equal-valued resistors are each 12K ohms. These resistances are chosen so that the circuit will have an output load current equal to the output drive current of the corresponding binary circuit; and in at least one practical embodiment, the output drive circuit is approximately 0.3 ma for the n-type element and less than 1.1 ma for the p-type element.

In this as in all circuits described herein, all substrates of p-type MOS transistors are connected to the positive power supply, and those of the n-types are connected to the negative power supply.

Referring to the truth table in Table I, it will be seen that when a zero voltage (logic level 1) is applied to the inverter input, the two devices 20 and 22 will be on—i.e., conducting—so that the potential at output terminal 16 will be +4 volts (PTI output at level 2) and the potential at output terminal 18 will be −4 volts (NTI output at level 0), giving a potential at output terminal 14—the output of the simple inverter—of zero voltage (level 1). This realizes the second row of Table I.

When the input voltage is at logic level 2 (+4 volts), the p-type device 20 will be off (non-conducting) and the n-type device 22 will be on, so that terminals 18, 14 and 16 will be at the negative voltage −4 volts. Thus, the STI, PTI and NTI outputs are at logic level 0, which is the inversion of the input at logic level 2.

Similarly, when the input voltage is at logic level 0, the p-type element 20 turns on and the n-type element 22 turns off. Thus, the output terminal 16 will be at +4 volts, as will the output terminals 14 and 18, so that the STI, PTI and NTI outputs are at +4 volts (logic level 2), which is the inversion of the input.

The quiescent power dissipation of an inverter such as that shown in FIG. 1 is higher than that for a binary inverter. This is because of the two equal-valued resistors 28 and 30 which are inserted between the two channels of the complementary unit, and because both the p-type and n-type elements are conducting when the input is at logic level 1, whereas only one element would be conducting in a binary inverter. Similarly, the dynamic power dissipation of the ternary inverter of FIG. 1 is slightly higher than that of a binary inverter, but the dynamic power dissipation may be greatly reduced with increased switching frequency. Thus, in a high data rate (fast-switching) system most of the power dissipation is dynamic and the quiescent power dissipation of the elements can be substantially neglected.

The operators referred to above—STI, PTI and NTI—as well as the ternary NOR (TNOR) and ternary NAND (TNAND)—which represent the two multiple entry fundamental operators—are all defined in equations 1 to 4 respectively, as set out below:

$$STI: \overline{X^1} = 2 - X \quad (1)$$

$$PTI, NTI: \overline{X^i} = \begin{pmatrix} i & \text{if } X \neq i \\ 2 - i & \text{if } X = i \end{pmatrix} \quad (2)$$

where $i$ takes the value of 2 for the PTI, and 0 for the NTI operator.

$$TNOR: \overline{(X + Y)^1} = \overline{\max (X, Y)^1} \quad (3)$$

$$TNAND: \overline{(X \cdot Y)^1} = \overline{\min (X, Y)^1} \quad (4)$$

Also, the ternary NOR and ternary NAND operators are considered hereafter in Table II, together with the inversions of a ternary OR (TOR) and ternary AND (TAND).

Truth table of two-entry ternary operators

| x | y | TOR $x \vee y$ | TNOR $x \overline{\vee} y$ | TAND $x \wedge y$ | TNAND $x \overline{\wedge} y$ |
|---|---|---|---|---|---|
| 2 | 2 | 2 | 0 | 2 | 0 |
| 2 | 1 | 2 | 0 | 1 | 1 |
| 2 | 0 | 2 | 0 | 0 | 2 |
| 1 | 2 | 2 | 0 | 1 | 1 |
| 1 | 1 | 1 | 1 | 1 | 1 |

-continued

| x | y | TOR $x \lor y$ | TNOR $x \overline{\lor} y$ | TAND $x \land y$ | TNAND $x \overline{\land} y$ |
|---|---|---|---|---|---|
| 1 | 0 | 1 | 1 | 0 | 2 |
| 0 | 2 | 2 | 0 | 0 | 2 |
| 0 | 1 | 1 | 1 | 0 | 2 |
| 0 | 0 | 0 | 2 | 0 | 2 |

Referring now to FIG. 2, there is shown a three-valued logic operator having two-entry three-valued input and having a ternary NOR output. The ternary NOR operator 32 comprises two pairs of complementary p-type and n-type metal oxide semiconductor transistors; namely, a first p-type element 34 and a second p-type element 36 which are connected in series, and a first n-type element 38 and a second n-type element 40 which are connected in parallel. It will be noted that there is a pair of input terminals 42 and 44, with input terminal 42 being connected to the gate of p-type element 34 and the gate of n-type element 40; whereas input terminal 44 is connected to the gate of p-type device 36 and also to the gate of n-type device 38. The source of p-type device 34 is connected to a positive power supply 46; and the source of each of the n-type devices 38 and 40 are connected to a negative power supply 48. The source of the second p-type device 36 is connected to the drain of the first p-type device 34, with a point 50 between them. The drains of each of the n-type devices 38 and 40 are connected together, and to the second of a pair of equal-valued resistors 52 and 54. The first resistor 52 is connected to the drain of the second p-type device 36; and there is a common connection and output at 56 between the equal-valued resistors 52 and 54. Likewise, there may be output terminals at 58 connected to the drain of the second p-type device 36, and at 60 connected to the drains of the first and second n-type devices 38 and 40. As in the case of the three-valued inverter 10 of FIG. 1, output terminals 58, 56 and 60 represent outputs of positive TNOR, simple TNOR (or TNOR as referred to herein), and negative TNOR, respectively.

The operation of the TNOR element 32 of FIG. 2 is as follows:

When inputs 42 and 44 are identical, the circuit acts as a three-valued inverter. If the inputs are both at logic level 1 (zero potential), all four devices are conducting, and terminal 58 will be high with terminal 60 low, so that the output terminal 56 will remain at zero potential. If both of the inputs 42 and 44 are at logic level 2, the two p-type devices 34 and 36 are off, and the two n-type devices 38 and 40 are on so that output terminal 60 and therefore output terminals 56 and 58 will be at −4 volts, logic level 0, which is the inversion of the inputs at 42 and 44. Likewise, if the inputs are both at logic level 0, the p-type devices 34 and 36 will be conducting whereas the n-type devices 38 and 40 will not be conducting, so that the output terminal 58 and therefore the output terminals 56 and 60 will be at +4 volts, logic level 2, which is the inversion of the inputs.

If, however, the two inputs are not equal, the operation will be as follows:

If input 42 is at logic level 2, and input 44 is at logic level 1, both of the p-type devices 34 and 36 will be off because the point 50 between them is at zero potential. At the same time, both of the n-type devices 38 and 40 will be on, output terminal 60—and therefore output terminals 56 and 58—will be at −4 volts, logic level 0—which is the inverse (negatively, simply or positively, respectively), of the maximum of the inputs.

When the input 42 is at logic level 0 and the input 44 is at logic level 1 (−4 volts and zero volts, respectively,) both of the p-type devices 34 and 36 will be on and output terminal 58 will be at +4 volts. The first n-type device 38 will be off, but the second n-type device 40 will be on, so that the output terminal 60 will be at logic level 0 (−4 volts), and therefore the voltage at output terminal 56 will be zero, logic level 1.

Likewise, when the input 42 is at logic level 2 and the input 44 is at logic level 0, both of the p-type devices 34 and 36 will be off because the point 50 between them is at zero potential, whereas the first n-type device 38 will be on while the second n-type device 40 will be off. In this case, output terminals 60, 56 and 58 will be at −4 volts, logic level 0, so that once again the output is the inverse of the maximum of the inputs.

Obviously, a ternary OR (TOR) operator can be realized by the mere insertion of a simple ternary inverter 10 in the output of the TNOR circuit 32 (output 56, 58 or 60).

Referring now to FIG. 3, a ternary NAND (TNAND) operator 62 is shown, and it also comprises two pairs of complementary p-type and n-type metal oxide semiconductor transistors. In this case, the first p-type device 64 is connected in parallel with the second p-type device 66, and the first n-type device 68 is in series with the second n-type device 70. The source of each of the p-type devices 64 and 66 are connected to a positive power supply 72; and the source of the second n-type device 70 is connected to a negative power supply 74. The drains of each of the p-type devices 64 and 66 are connected to each other and thence to the first of a pair of equal-valued resistors 76 and 78. The drain of the second n-type device 70 is connected to the source of the first n-type device 68, and its drain is connected to the second resistor 78 of the equal-valued pair of resistors. An output terminal 80 is connected at the common connection between the resistors 76 and 78, and there may be output terminals 82 at the connection to the drains of the p-type devices 64 and 66 and 84 at the connection of the drain of the n-type devices 68 to resistor 78.

A pair of input terminals 86 and 88 are provided, with the input terminal 86 being connected to the gate of the first p-type device 64 and the gate of the first n-type device 68; whereas the second input terminal 88 is connected to the gates of each of the second p-type and n-type devices 66 and 70, respectively.

The operation of the TNAND circuit 62 is similar to the operation of the TNOR circuit 32 described above, and can be summarized as follows.

When the two inputs 86 and 88 are identical, the circuit will operate exactly as in the case of the TNOR circuit 32.

When the inputs are not equal, the operation is as follows:

If the input 86 is at logic level 2, and the input 88 is at logic level 1, p-type device 64 will be off and p-type device 66 will be on, so that the output terminal 82 will be at +4 volts, logic level 2. Both of the n-type devices 68 and 70 will be on, so that the output terminal 84 will be at −4 volts, logic level 0; and therefore the level at output terminal 80 will be zero voltage, logic level 1.

If the input 86 is at −4 volts, logic level 0, and the input 88 is at zero volts, logic level 1, both of the p-type devices 64 and 66 will be on and the output terminal 82 will be at +4 volts. Also, the second n-type device 70 will be on, but the first n-type device 68 will be off, so therefore the voltage at output terminals 80 and 84 will be +4 volts, logic level 2.

When the input 86 is +4 volts, logic level 2, and the input 88 is −4 volts, logic level 0, the first p-type device 64 will be off but the second p-type device 66 will be on, so that the potential at output terminal 82 will be +4 volts. The first n-type device 68 will be off because the second n-type device 70 will be off and the point 90 between them will be at zero potential. Thus, the output terminals 80 and 84 will be at +4 volts, logic level 2.

From the above, it will be seen that the outputs 82, 80 and 84 of the TNAND circuit 62 is always the positive, simple and negative inverse, respectively, of the minimum input.

It is obvious, in the same manner as referred to with respect to the TNOR circuit 32, that the TNAND circuit 62 can be inverted to a ternary AND (TAND) operator by the insertion of a simple ternary inverter 10 in the output of the TNAND operator 62.

Figure 5:
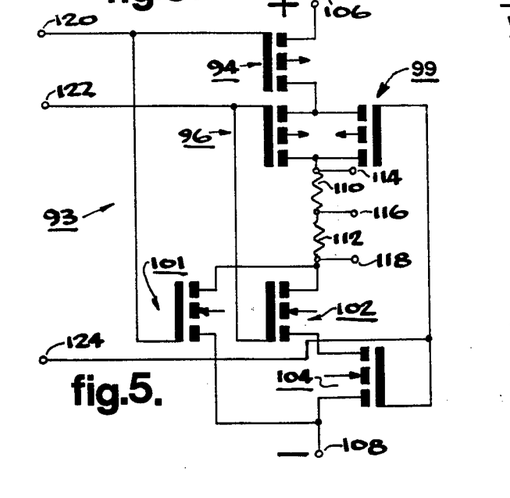

Referring now to FIGS. 4 and 5, there are shown two different circuits which have been constructed—each of which derives substantially from TNOR gate 32 or TNAND gate 62—to realize ternary AND-OR-INVERT operators which permit implementation of simple ternary inverter, positive ternary inverter, negative ternary inverter, ternary NOR and ternary NAND functions.

Thus, the ternary AOI circuit 92 of FIG. 4 comprises three pairs of complementary p-type and n-type metal oxide semiconductor transistors. The first and second p-type devices, 94 and 96 respectively are connected in series, and the third p-type device 98 is connected in parallel to the series connected p-type devices 94 and 96. Likewise, the first and second n-type devices 100 and 102 are connected in parallel, with the third n-type device 104 in series with the parallel connected n-type devices 100 and 102. The substrates of all of the p-type devices are connected to the positive power supply 106, and the substrates of the n-type devices are connected to the negative power supply 108. The sources of p-type devices 94 and 98 are each connected to the positive power supply 106, and the drain of the first p-type device 94 is connected to the source of the second p-type device 96. The sources of the first two n-type devices 100 and 102 are connected to the drain of the third n-type device 104, and the drains of n-type devices 100 and 102 are commonly connected to resistor 112 of a pair of equal-valued resistors 110 and 112. The drains of the second and third p-type devices 96 and 98 are commonly connected to the first resistor 110 of the pair of equal-valued resistors.

Output terminals 114, 116 and 118 are connected at the common connection of the second and third p-type devices 96 and 98, the common connection of the equal-valued resistors 110 and 112, and the common connection of the first and second n-type devices 100 and 102, respectively. Input 120 is connected to the gates of the first p-type device 94 and the first n-type device 100; input 122 is connected to the gate of the second p-type device 96 and the second n-type device 102; and input 124 is connected to the gates of the third p-type device 98 and the third n-type device 104.

The operation of the ternary AOI circuit 92 of FIG. 4 can be briefly described as follows:

When either input 120 or 122 is at logic level 2, the respective n-type device 100 or 102 will be on, which permits the use of the third p-type and n-type devices 98 and 104, together as a simple ternary inverter, positive ternary inverter or negative ternary inverter circuit, depending on which output is taken according to the following rules:

$PTI$: at 114 = $\overline{Z}^2$ $STI$: at 116 = $\overline{Z}^1$ $NTI$: at 118 = $\overline{Z}^0$ The ternary AOI circuit of FIG. 4 will be used as a TNAND gate when the input 120 will be at logic level 0. At that time, the first p-type device 94 will be on, and the p-type devices 96 and 98 together with the n-type devices 102 and 104 will form the TNAND gate giving an output TNAND: at 116 = $\overline{(Y \cdot Z)}^1$.

Similarly, p-type devices 94 and 98 together with n-type devices 100 and 104 will form a TNAND gate if the input 122 is at logic level 0, because the second p-type device 96 will be on. In that case, the TNAND output will be TNAND: at 116 = $\overline{(X \cdot Z)}^1$.

A TNOR gate may also be realized, if the input 124 is at logic level 2. Then, the p-type devices 94 and 96 together with the n-type devices 100 and 102 will form the TNOR gate because the p-type device 98 will be off, and the output will be TNOR: at 116 = $\overline{(X + Y)}^1$. From the above, it can be concluded that the output 116 realizes the function TAOI: at 116 = $\overline{(X + Y \cdot Z)}^1$.

This same function may also be realized by the application of the ternary AOI circuit of FIG. 5. In the circuit of FIG. 5, which is similarly annotated to the ternary circuit of FIG. 4 except that the circuit is designated 93, it will be noted that, with respect to ternary AOI circuit 92 of FIG. 4, the third p-type device 98 has been replaced by p-type device 99 whose source is connected to the common connection between the drain of the first p-type device 94 and the source of the second p-type device 96. Likewise, the first n-type device 100 of the ternary AOI circuit 92 of FIG. 4 has been replaced by a first n-type device 101 in the ternary AOI circuit 93 of FIG. 5, and the source of the first n-type element 101 is, in this case, connected to the negative power supply 108 in common with the source of the third n-type device 104.

The ternary AOI circuit 93 of FIG. 5 will be used as any inverter if the input 122 or 124 is at logic level 0, as a TNAND gate if the input 120 is at logic level 0, and as a TNOR gate if either input 122 or 124 is at logic level 2.

Figure 6:
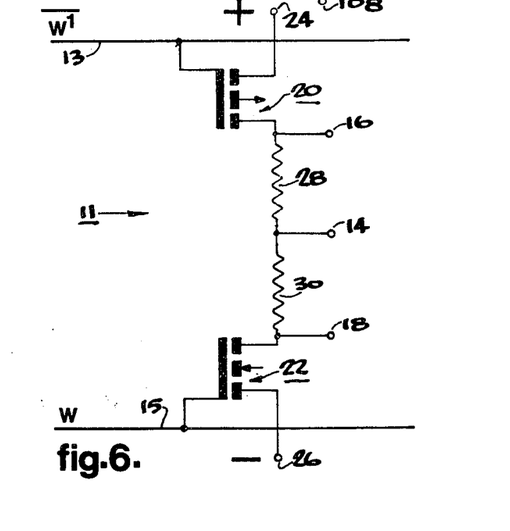
FIG. 6 shows a modified ternary inverter having complementary inputs.

It follows that the output terminals 114 and 118 can be used to realize positive and negative TNAND and TNOR outputs, and that if the TNAND and TNOR gates are simply considered as inverters, then the above relationships with respect to the ternary AOI circuits 92 and 93 can be regarded as simple TNAND and simple TNOR outputs. Therefore, positive TNAND and TNOR outputs at terminal 114 can be realized, as follows:

$P\ TNAND$: at 114 = $\overline{(Y \cdot Z)}^2$ $P\ TNOR$: at 114 = $\overline{(Y + X)}^2$ Similarly, negative TNAND and negative TNOR outputs at terminal 118 can be realized, as follows:

$N\ TNAND$: at 118 = $\overline{(Y \cdot Z)}^0$ $N\ TNOR$: at $118 = \overline{(Y + X)^0}$ Finally, a further basic logic element according to this invention is shown in FIG. 6, and is a modified ternary inverter 11 which derives from the ternary inverter 10 of FIG. 1, except that the input 12 of the ternary inverter 10 is divided into a pair of complementary input terminals—or word lines—designated 13 and 15 respectively. In this modified ternary inverter, it will be noted that the gate of the p-type element 20 is connected to the input or word line 13, and the gate of the n-type element 22 is connected to the input or word line 15. The other elements of the modified ternary inverter 11 of FIG. 6 remain as shown in the ternary inverter 10 of FIG. 1, and are similarly annotated.

Ternary Storage Elements—There follows hereafter a description of a plurality of ternary storage elements, and thereafter is a description of ternary shift registers, ternary counters and a ternary read-only-memory. All of the elements and ternary logic circuits which follow are based on the ternary logic operators discussed above, and are exemplary of typical, practical operating logic circuits which may be realized in accordance with this invention.

The basic storage ternary element which is discussed herein comprises two STI circuits which are cross-coupled to form a tri-flop. A ternary random-access-memory (TRAM) cell may be constructed using this circuit with a ternary switch. The ternary switch can be used as a simple and efficient means of performing the sensing and storage functions associated with storage-cell selection.

Figures 7, 8A, 9:
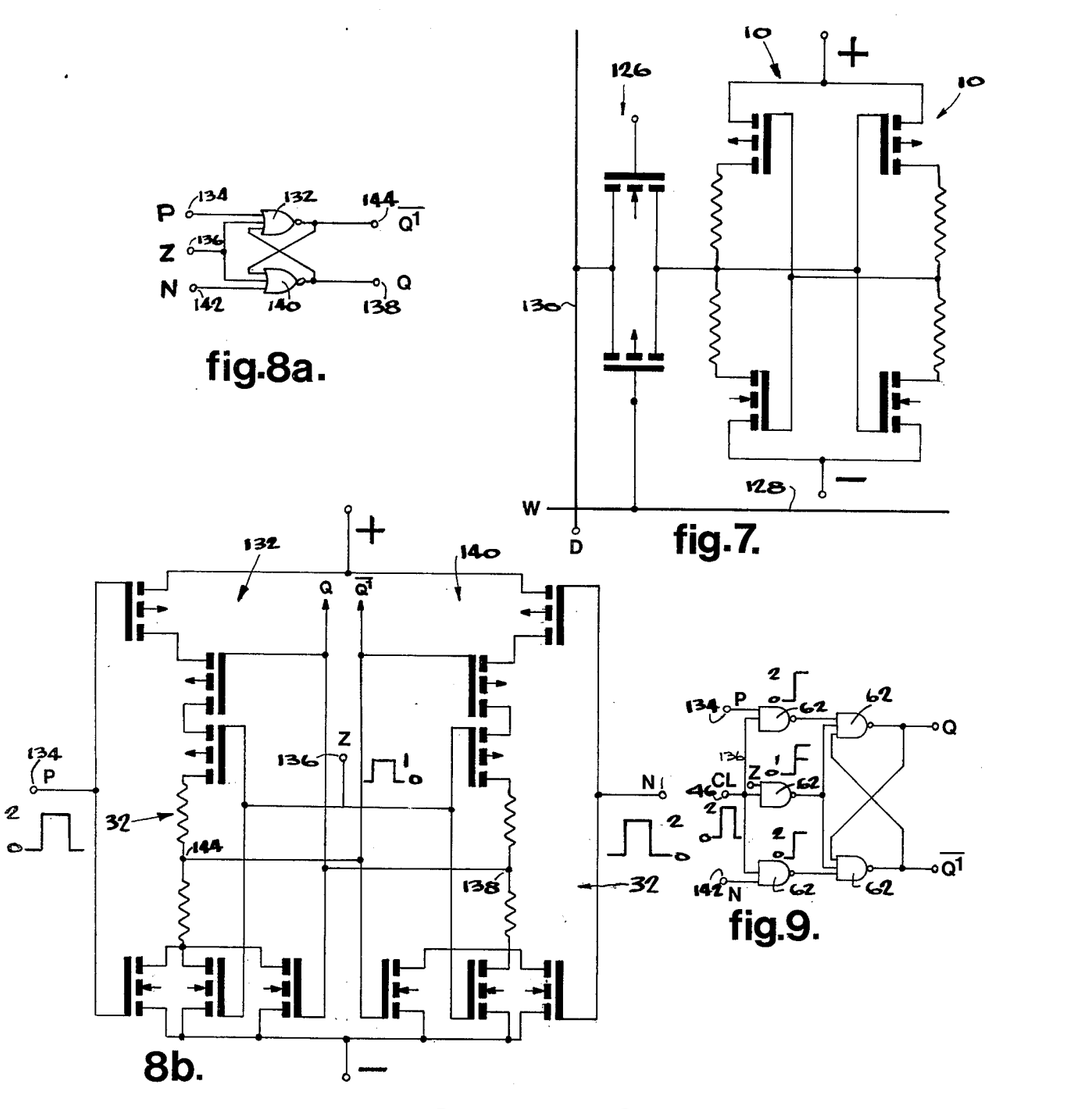

FIG. 7 shows a ternary word-organized storage-cell which comprises two STI circuits 10, cross-coupled connected, with a simple ternary switch 126, a word line 128 and a data line 130. Addressing of the word-organized storage-cell of FIG. 7 is accomplished by energizing a word line 128 whereby the ternary switch 126 of the selected tri-flop turns on.

A trit-organized memory cell employing X-Y selection can be obtained by adding a further ternary switch to the circuit of FIG. 7 so as to form, with the original ternary switch 126, the X-Y addressing wires. This circuit can be used as a basic element of a large ternary memory array.

The PZN Tri-Flop—FIG. 8a shows a block diagram and FIG. 8b shows a schematic diagram of a PZN tri-flop according to this invention. The PZN tri-flop is constructed by cross-coupling two TNOR gates 32. It can be seen that the first TNOR gate 132 has three inputs: a P input 134 for setting the tri-flop to the high logic level 2, a Z input 136 for setting the tri-flop to zero voltage—i.e., logic level 1—and a third input which is taken from the output Q at 138 of the second TNOR gate 140. The third input 138 to the first TNOR gate 132 assures the regenerative property of the tri-flop. The second TNOR gate 140 also has three inputs: an N input 142 to set the tri-flop to the logic level 0, the same Z input 136 to set the tri-flop at the logic level 1, and a third input 144 taken from the output $\overline{Q^1}$ 144 of the first TNOR gate 132.

To set the tri-flop to logic state 2, a low to high (0 to 2) pulse is inserted at the P input 134. The output 144 of the first TNOR gate 132 will be at the low level 0, therefore the three inputs 136, 142 and 138 of the second TNOR gate 140 will be at the low level 0 and its output will be at the high level, in logic state 2. This will force the output of the first TNOR gate 132 to stay low at the logic state or level 0, which thereby keeps the tri-flop in a stable condition. Under these conditions, the tri-flop is said to be in the high state.

If, however, a low to intermediate pulse (0 to 1) is inserted at the Z input 136, the output of the first TNOR gate 132 will be at the zero potential or logic level 1, and the other TNOR gate 140 will also have its output at the zero potential or logic level 1, which will keep the tri-flop in its intermediate stable state.

Likewise, the tri-flop of FIG. 8 will be in its low stable state if a low to high (0 to 2) pulse is inserted at the N input 142. In this case, the output 138 of the second TNOR gate 140 will be in the low state—logic level 0—so that the TNOR gate 132 will have all three of its inputs at logic level 0 and will produce a high level (logic level 2) output at its output terminal 144, which will, of course, keep the second TNOR gate 140 in its low level and thus keep the tri-flop in its low stable state.

Clocked PZN Tri-Flop—FIG. 9 shows a clocked PZN tri-flop having the same input signals, and in the same manner, as the PZN tri-flop discussed above with reference to FIG. 8. However, the clocked PZN tri-flop is constructed by cross-coupling two TNAND gates 62 and controlling the three inputs P (134), Z (136), and N (142) with three additional TNAND gates 62. In this case, the tri-flop will change states as described above with reference to the circuit of FIG. 8, but only when a low to high (0 to 2) pulse is present at the clock input terminal 146.

D-Type Tri-Flop—The D-type tri-flop according to this invention may easily be constructed by cross-coupling two TNAND gates 62 and inverting the input of one of them using a simple ternary inverter 10, as illustrated in block circuit form in FIG. 10a. In this circuit, the next-states table is determined according to Table III, as follows:

Next-states table for the D-type tri-flop

| D | Q(t) | | |
|---|---|---|---|
|   | 2 | 1 | 0 |
| 2 | 2 | 2 | 2 |
| 1 | 1 | 1 | 1 |
| 0 | 0 | 0 | 0 |
|   | Q(t + 1) | | |

From the next-states table above, it will be seen that the output Q, 148, will follow the input D, 150, at whatever state the input D may be.

Of course, the D-type tri-flop of FIG. 10a can be clock controlled by a clock pulse at input 151, in accordance with the block diagram of a clocked D-type tri-flop shown in FIG. 10b. In this case, a clock pulse is inserted at input 151 to two further TNAND gates 62 which are inserted one in each of the inputs of the original cross-coupled TNAND gates which form the basic tri-flop. The clocked tri-flop of FIG. 10b will hold its state indefinitely if no clock pulse appears at clock input terminal 151.

Figure 11:
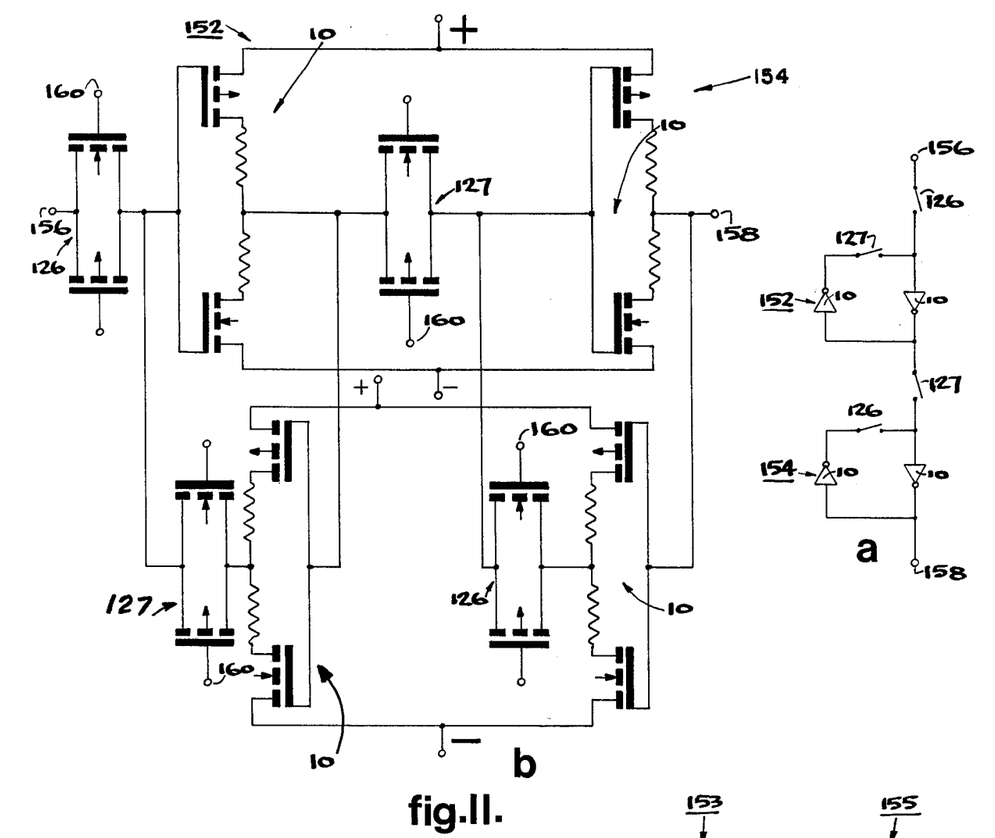

There is shown in FIG. 11a a block diagram, and in FIG. 11b a schematic diagram, of a master-slave D-type tri-flop. In this case, it will be seen that the master tri-flop 152 is formed of two ternary inverters 10 and two ternary switches which, for purposes of the discussion to follow, are designated 126 and 127. The slave tri-flop 154 is similarly constructed of two ternary inverters 10 and two ternary switches 126 and 127 which are in the reverse order to that of the master tri-flop 152.

When the control voltage signal $V_c$ at terminals 160 of the ternary switches is at the high level, i.e. logic level 2, the ternary switches 126 will be closed and the ternary switches 127 will be open. In this circuit configuration, the master tri-flop 152 may sample incoming data at input terminal 156, and the slave tri-flop 154 will hold the data from the previous input at terminal 156 and feed the data from the previous input to the output terminal 158. Then, when the control signal is low, at logic level 0, the ternary switches 126 will open and the ternary switches 127 will close, thus enabling the master tri-flop 152 to hold the data entered to it and to feed that data to the slave tri-flop 154.

Figure 12:
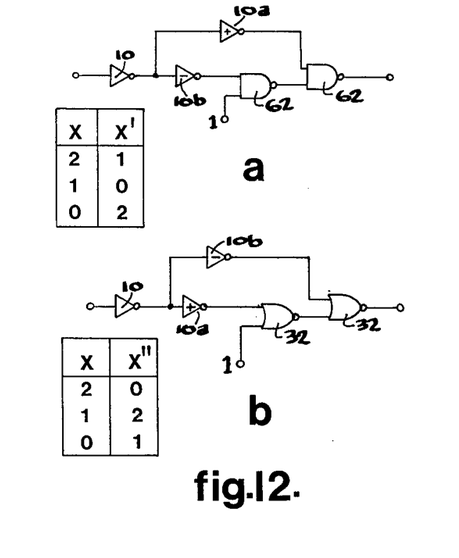

T-Type Tri-Flop—In the same manner as a $J_k$ flip-flop is the most important binary element, so to is a T-type tri-flop the most important element in the design of ternary sequential circuits. The T-type tri-flop is constructed by inserting an inverse cycling gate in a feedback path between the Q output 158 and the D input 156 of a D-type tri-flop of FIG. 11a. An inverse cycling gate is defined, for these purposes, as $$x'' = (x + 1) \bmod 3$$

and similarly a cycling gate is defined as $$x' = (x - 1) \bmod 3$$

It is clear in the above, that the signs are arithmetic addition and subtraction signs. FIG. 12a shows a block diagram for a cycling gate, and a truth table for that cycling gate; and FIG. 12b shows a block diagram and truth table for an inverse cycling gate. It will be noted that each circuit includes a simple ternary inverter 10, a positive ternary inverter 10a and a negative ternary inverter 10b; as well as the respective TNAND gate 62 or TNOR gates 32.

Figure 13:
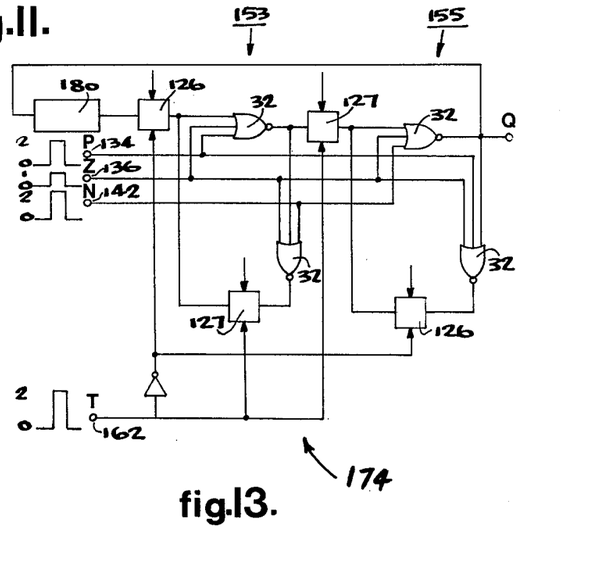

Referring now to FIG. 13, there is shown a master-slave T-type tri-flop, having P, Z and N capabilities. In the master-slave T-type tri-flop of FIG. 13, as compared with the master-slave tri-flop of FIG. 11, the inverters 10 of the FIG. 11 configuration have been replaced by TNOR gates 32, in order that several inputs may be available. The P, Z and N input pulses to terminals 134, 136 and 142 respectively are the same as referred to in the discussion of the PZN tri-flop of FIG. 8, above.

The performance of the master-slave T-type tri-flop is set out in Table IV, below:

Next-states table for the T-type tri-flop

| T | P | Z | N | Q(t) | Q(t + 1) |
|---|---|---|---|------|----------|
| 2 | 0 | 0 | 0 | 0 | 1 |
| 2 | 0 | 0 | 0 | 1 | 2 |
| 2 | 0 | 0 | 0 | 2 | 0 |
| 2/0 | 2 | 0 | 0 | D | 2 |
| 2/0 | 0 | 1 | 0 | D | 1 |
| 2/0 | 0 | 0 | 2 | D | 0 |
| 0 | 0 | 0 | 0 | D | Q(t) |
| other combinations | | | | D | F |

From the above table, it can be seen that when the P, Z or N inputs are used, the T input 162 can be at logic level 2 or logic level 0. If the design of the master-slave T-type tri-flop is modified so as to permit utilization of the P, Z or N inputs only when the T input 162 is at logic level 0, the master tri-flop 153 could be formed using simple ternary inverters 10 of FIG. 1 instead of TNOR gates 32. Likewise, if the design is modified to permit utilization of P, Z or N inputs only when the T input 162 is at logic level 2, the slave tri-flop 155 could be formed using simple ternary inverters instead of the TNOR gates 32 as shown.

Figure 10:
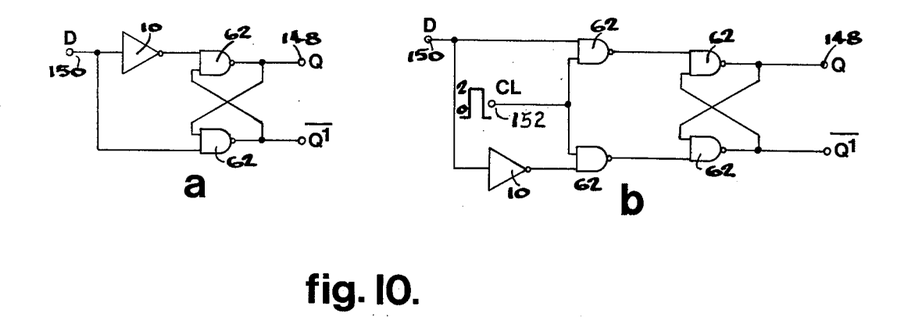

Ternary Shift Registers—It is now obvious that the clocked PZN tri-flop of FIG. 9 and the D-type tri-flop of FIG. 10, each described above, can be considered as one stage of a static ternary shift register.

Figures 14, 15:
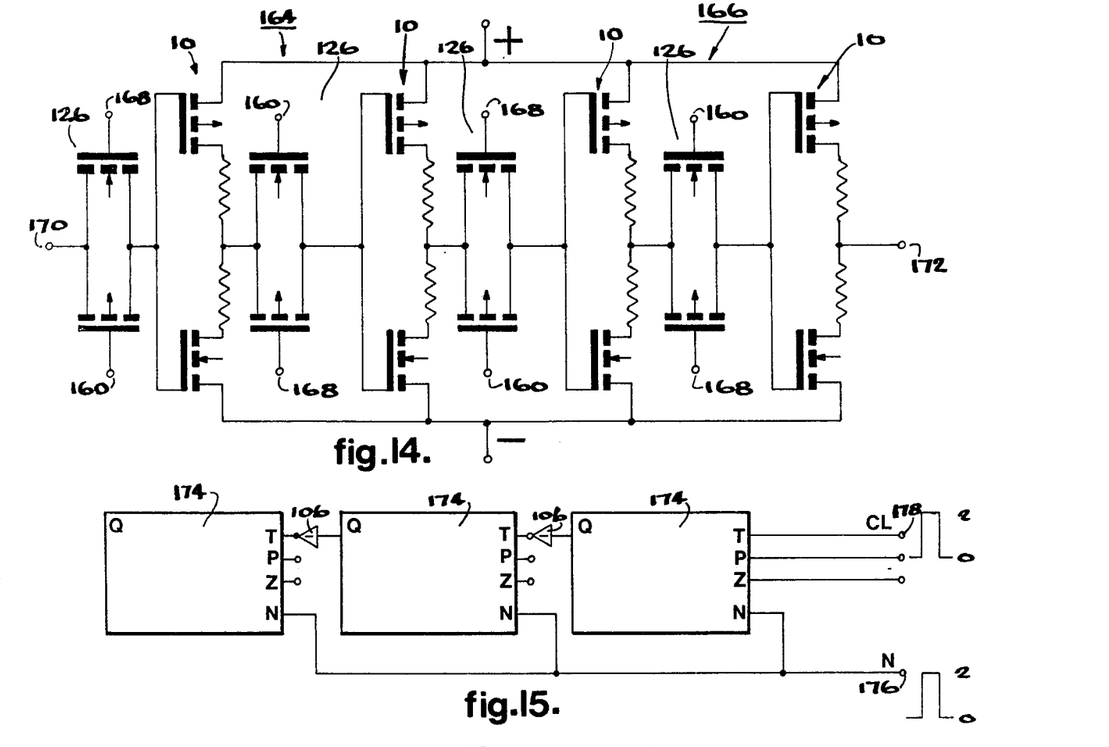

A dynamic ternary shift register can be constructed in the manner shown in FIG. 14, which shows a two-stage shift register according to the present invention. Each of the stages 164 and 166 comprises two simple ternary inverters 10 and two ternary switches 126. Each of the ternary switches is controlled by two complementary clock signals $V_c$ at terminals 160 and $\overline{V_c}^1$ at terminals 168. Thus, when alternate ternary switches are turned on, the other ternary switches are turned off and vice versa. The shift register will utilize the input capacitance of the simple ternary inverter 10 for temporary storage.

Accordingly, when a signal is inserted at the input terminal 170, and the first ternary switch is turned on, the signal is coupled to the first ternary inverter 10. At the next clock signal, the first ternary switch is turned off and the second ternary switch is turned on, so that the signal in the first simple ternary inverter 10 is coupled to the second simple ternary inverter, and so on. Therefore, when the first ternary switch of each stage of the shift register is turned on, it couples the signal from the previous stage in the shift register (or the input in the case of the first stage), and causes that signal to be stored on the input capacitance of the simple ternary inverter. When the first ternary switch of each stage is turned off on the next half cycle of the clock train, and the second ternary switch of each stage is turned on, the signal is stored on the input capacitance of the first ternary inverter and is available and is coupled through the second ternary switch to the second ternary inverter of each respective stage. Once again, the signal is applied to and is stored on the input capacitance of the second ternary inverter, which thereby makes that signal available at the output of that stage or, in the case of the last stage, at output terminal 172.

Obviously, the above description may be carried on for a multiple stage ternary shift register, irregardless of whether or not the level of the input signal at input terminal 170 is at logic level 0, 1 or 2. The ternary signal no matter at which level it is inserted at the input terminal, is shifted to the right by one complete stage per one complete clock cycle, and appears at the input of each stage in the same manner as it was first inserted, having been inverted twice in the preceding stage.

It has been noted that, as a practical consideration, there is a minimum frequency at which the dynamic shift register can operate because of the dependence on the stored charge in the input capacitance of each ternary inverter, and obviously that stored charge is subject to decay. Reliable operation, using the CMOS (or COS/MOS) complementary semiconductor chips referred to above, can be obtained at frequencies as low as 100 Hz.

Ternary Counters—A ring ternary counter may be constructed by cascading master-slave D-type tri-flops and feeding back the output of the last stage to the input of the first stage. The ring ternary counter may, of course, have any specific integral number of stages. At each clock pulse, from low to high (logic level 0 to logic level 2), information which is stored in each stage or tri-flop—each of which can be pre-set by way of its P, Z or N inputs—will be shifted one position to the left, and the leftmost significant trit will be shifted to the first tri-flop.

Thus, with reference to FIG. 15, there is shown a ternary counter which is designed to count from 0 to 27, or from −13 to +13. The ternary counter is formed of three stages 174, each of which consists of a master-slave T-type tri-flop of the sort shown in FIG. 13 and discussed above. In general, the ternary counter of FIG. 15 may be designed to count from 0 to $3^n$ using a normal ternary code or from $-(3^n-1)/2$ to $+(3^n-1)/2$, using the signed-ternary code. Of course, in each case, $n$ is the number of stages of the ternary counter. In the signed-ternary code, the number +1 is represented by a high level signal (positive, or logic level 2); 0 is represented at the intermediate level (zero potential or logic level 1); and −1 by the low level signal (negative or logic level 0).

As seen in FIG. 15, a negative ternary inverter 10b connects the input of each tri-flop stage 174 to the output of the preceding stage. The function of the negative ternary inverter 10b is to change the state of the tri-flop only when the state of the preceding tri-flop changes from high to low level. This is stated by the following relationship:

$$T_n = \overline{Q^0_{n-1}}$$

where $T_n$ represents the input of the $n^{th}$ stage and $Q_{n-1}$ represents the output of $n-1^{th}$ stage of the ternary counter. To reset the counter to its initial state, a low to high pulse (logic level 0 to logic level 2) is inserted at the N input 176 which goes to the N input 142 of each of the tri-flop stages 174, if the normal ternary code is used. Thus, all of the tri-flop stages 174 will be in the low level to represent the zero decimal number.

If, in the ternary counter of FIG. 15, a signed-ternary code is used, a low to intermediate pulse (logic level 0 to logic level 1) is inserted through the Z inputs 136 of each of the tri-flop stages 174, so that all of the tri-flops will be in the intermediate level to represent the zero decimal number. Obviously, the counter may also be pre-set to any initial number through the P, Z or N inputs of each of the tri-flops. For every low to high pulse (level 0 to level 2) sent through the clock input 178, the counter will operate and the tri-flops will change states in the manner set out below in Table V.

States of tri-flops in the ternary counter of FIG. 15.

| No of input pulses | Decimal number representation | Tri-flops outputs Normal ternary code | | | Decimal number representation | Signed ternary code | | |
|---|---|---|---|---|---|---|---|---|
| | | $Q_3$ | $Q_2$ | $Q_1$ | | $Q_3$ | $Q_2$ | $Q_1$ |
| 0 | 0 | 0 | 0 | 0 | −13 | −1 | −1 | −1 |
| 1 | 1 | 0 | 0 | 1 | −12 | −1 | −1 | 0 |
| 2 | 2 | 0 | 0 | 2 | −11 | −1 | −1 | +1 |
| 3 | 3 | 0 | 1 | 0 | −10 | −1 | 0 | −1 |
| 4 | 4 | 0 | 1 | 1 | −9 | −1 | 0 | 0 |
| 5 | 5 | 0 | 1 | 2 | −8 | −1 | 0 | +1 |
| 6 | 6 | 0 | 2 | 0 | −7 | −1 | +1 | −1 |
| 7 | 7 | 0 | 2 | 1 | −6 | −1 | +1 | 0 |
| 8 | 8 | 0 | 2 | 2 | −5 | −1 | +1 | +1 |
| 9 | 9 | 1 | 0 | 0 | −4 | 0 | −1 | −1 |
| 10 | 10 | 1 | 0 | 1 | −3 | 0 | −1 | 0 |
| 11 | 11 | 1 | 0 | 2 | −2 | 0 | −1 | +1 |
| 12 | 12 | 1 | 1 | 0 | −1 | 0 | 0 | −1 |
| 13 | 13 | 1 | 1 | 1 | 0 | 0 | 0 | 0 |
| 14 | 14 | 1 | 1 | 2 | 1 | 0 | 0 | +1 |
| 15 | 15 | 1 | 2 | 0 | 2 | 0 | +1 | −1 |
| 16 | 16 | 1 | 2 | 1 | 3 | 0 | +1 | 0 |
| 17 | 17 | 1 | 2 | 2 | 4 | 0 | +1 | +1 |
| 18 | 18 | 2 | 0 | 0 | 5 | +1 | −1 | −1 |
| 19 | 19 | 2 | 0 | 1 | 6 | +1 | −1 | 0 |
| 20 | 20 | 2 | 0 | 2 | 7 | +1 | −1 | +1 |
| 21 | 21 | 2 | 1 | 0 | 8 | +1 | 0 | −1 |
| 22 | 22 | 2 | 1 | 1 | 9 | +1 | 0 | 0 |
| 23 | 23 | 2 | 1 | 2 | 10 | +1 | 0 | +1 |
| 24 | 24 | 2 | 2 | 0 | 11 | +1 | +1 | −1 |
| 25 | 25 | 2 | 2 | 1 | 12 | +1 | +1 | 0 |
| 26 | 26 | 2 | 2 | 2 | 13 | +1 | +1 | +1 |

With reference to the above discussion, it must be noted that since all of the tri-flops of the counter, except the first tri-flop, may be reset when their inputs are in the low or high levels, the master or slave tri-flop of each stage may not be constructed using simple ternary inverters as discussed above with reference to an alternative arrangement of the master-slave circuits of FIG. 13, but each master and slave tri-flop 153 and 155 respectively of each slave must be constructed using TNOR gates 32 so as to have the extra inputs required for resetting or pre-setting purposes.

It can also be noted that a ternary down counter which can count from $3^n$ to zero or from $+(3^n-1)/2$ to $-(3^n-1)/2$ can be easily constructed merely by replacing the inverse cycling gate 180 of the circuit arrangement of FIG. 13 with a cycling gate, and by replacing the negative ternary inverters 10b between stages by positive ternary inverter followed by a simple ternary inverter.

Figures 16, 17:
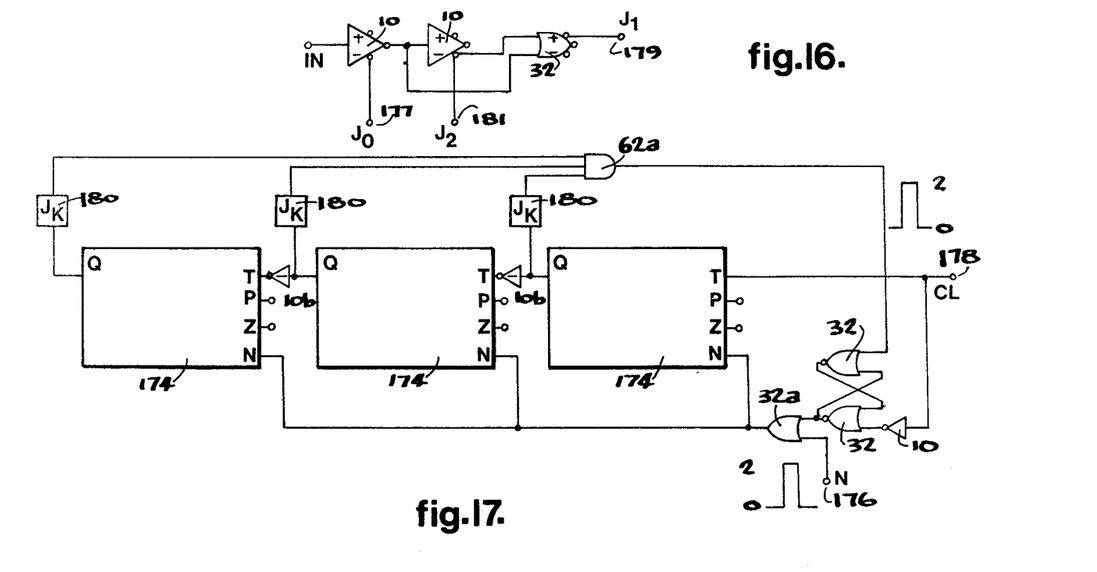

A divide-by-M ternary counter—which is analogous to a divide-by-N binary counter—is shown in FIG. 17. In this case, the ternary counter of FIG. 15 is joined together with a feedback circuit which includes a TAND gate 62a having a number of inputs which is equal to the number of stages in the counter. Each input of the TAND gate 62a comes from a $J_k$ arithmetic circuit which is mounted on the output Q of each tri-flop stage 174. The output of the TAND gate 62a is used to reset the counter to its initial state after a number of pulses taken from each of the $J_k$ arithmetic circuits 180. Each of the outputs from the $J_k$ arithmetic circuits 180 may be $J_0$ (at 177), $J_1$ (at 179) or $J_2$ (at 181). The $J_k$ arithmetic circuit is defined by the following relationship:

$$J_k(x) = \begin{cases} 2 \text{ if } K = x \\ 0 \text{ if } K \neq x \end{cases}$$

where $k = 0$, 1 or 2; and is shown in FIG. 16.

As an example of the design of a decade ternary counter, the outputs $J_0$, $J_0$ and $J_1$ will be taken from the $J_k$ arithmetic circuits 180 mounted on the first, second and third tri-flop stages 174 respectively, going from right to left in FIG. 17. The divide-by-M ternary counter can be programmed to count any number M from 0 to $3^n$ where $n$ is the number of stages of the counter.

A latch circuit is added in the feedback path shown in FIG. 17, and it comprises cross-connected TNOR circuits 32, together with a simple ternary inverter 10 from the clock input 178 with the output of the cross-connected TNOR gates and the N input to a TOR gate 32a. This assures reliable clearing of the counter at the $M^{th}$ pulse which may not otherwise be reliable if the propagation delay from the N input to the tri-flop output varies from stage to stage. This variation may occur if the counter outputs are unevenly loaded. It has been found, in practice, that good operation may be obtained when the width of the clock pulse at clock input terminal 78 is in the range of 70 to 370μ sec.

The TAND gate 62a and TOR gate 32a derived from TNAND gate 62 and TNOR gate 32, respectively, but with a non-inverted (double-inverted) output as discussed above.

Figure 18:
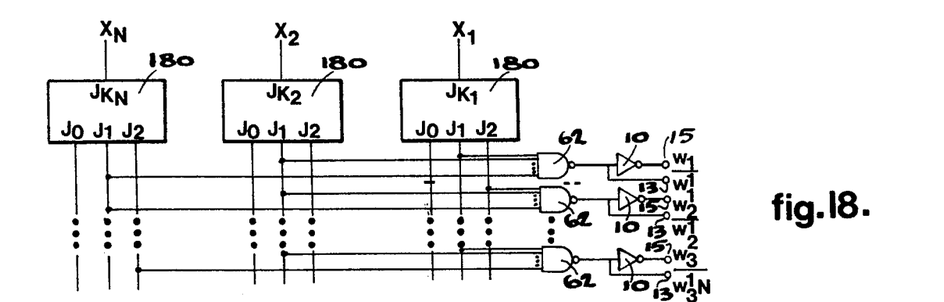

Ternary Read-Only-Memory—A ternary read-only-memory (TROM) ordinarily consists of a ternary decoder followed by a ternary encoder, which is the memory matrix. FIG. 18 shows a ternary decoder having N inputs and $3^N$ outputs. This decoder is composed of N $J_k$ arithmetic circuits 180 of the sort referred to above, each having $J_0$, $J_1$ and $J_2$ outputs. The circuit also comprises $3^n$ TNAND gates 62 and $3^n$ simple ternary inverter circuits 10. All of the word lines 13 and 15 will be at the low level except for the one which was designated at the inputs. They will take the value defined by:

$$W_i = J_{K_1}(X_1) \cdot J_{K_2}(X_2) \ldots J_{K_N}(X_N)$$

where
$i = K_1 3^0 + K_2 3^1 + \ldots + K_N 3^{N-1}$, and $K_1, K_2 \ldots K_N$ can take the values of 0, 1 or 2,
$W_i$ is the word-line, and
$X_1, X_2 \ldots X_N$ are the N inputs.

The basic element of the ternary memory matrix is, of course, the modified ternary inverter (MTI) 11 of FIG. 6, which was discussed above.

With reference to the MTI 11 of FIG. 6, if the input line 15 connected to the gate of the n-type element 22 is high, the n-type element 22 will be on and the p-type element 20 will also be on because work-line 13 will be low. Therefore, the MTI 11 of FIG. 6 will act exactly as a ternary inverter when its input is at zero potential (logic level 1). The output from terminal 16 will be high (at logic level 2), the output from terminal 18 will be low (at logic level 0) and the output from terminal 14 will be at the intermediate level (logic level 1). If the word-line 15 is low, each of the p-type and n-type elements 20 and 22 will be off, and the modified ternary inverter 11 will act as if it were an open circuit.

Figure 19:
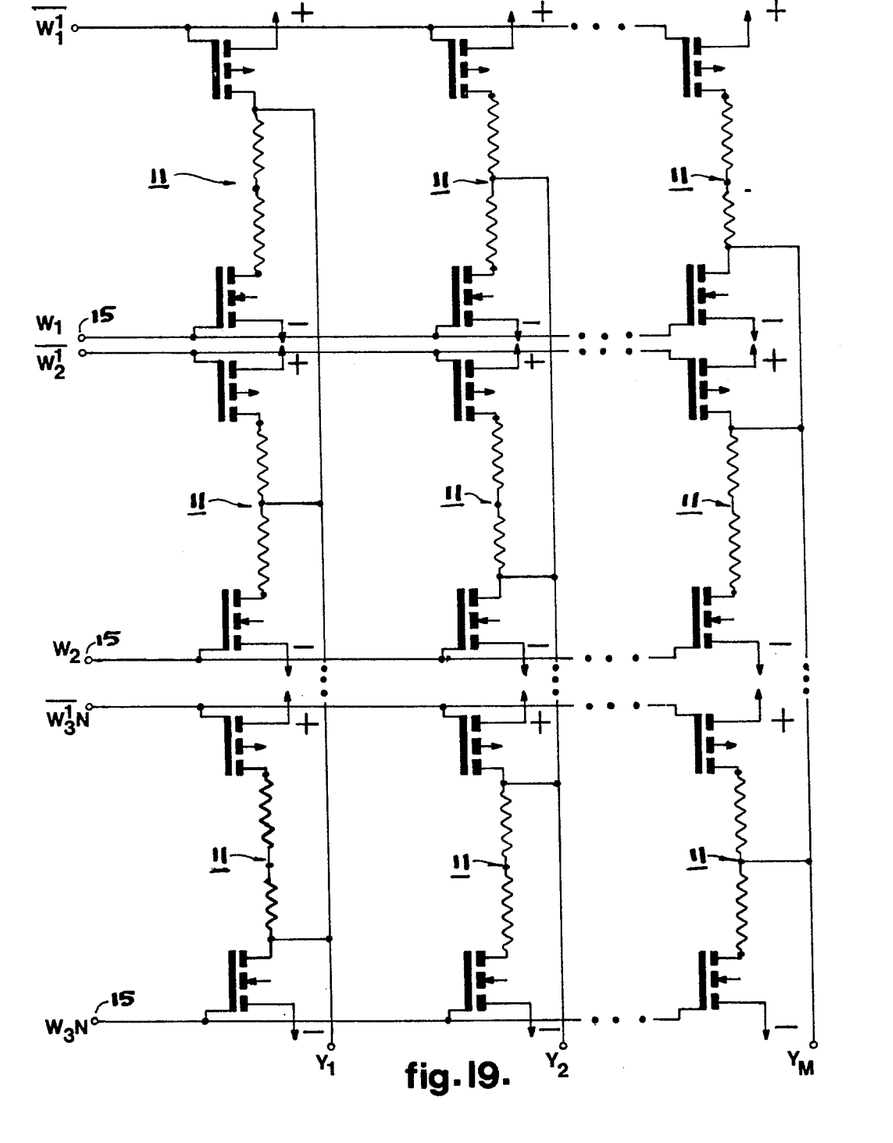

Referring now to FIG. 19, there is shown a ternary read-only-memory (TROM) encoder, having $3^n$ inputs and $m$ outputs. The TROM encoder of FIG. 18 comprises $m \times 3^n$ MTI memory cells 11. Since only one of the word-lines 15 will be high, and all other word-lines 15 will be low, in each column there will only be one MTI cell 11 on and all of the other MTI cells will be off, i.e. appearing to be open circuits. Therefore, a wire OR gate of all of the MTI cells of each column may be made without any problem. Each trit-line will be 2, 1 or 0 depending upon how the output of the only energized MTI cell 11 in each column is taken from its respective output terminal 16, 14 or 18. The outputs on the trit-lines will have the values of:

$$Y_i = \widetilde{W}_1 + \widetilde{W}_2 + \ldots + \widetilde{W}_3 N$$

where
$i = 1, 2 \ldots M$
$Y_i$ are the trit-lines and
$\widetilde{W}_1, \widetilde{W}_2 \ldots \widetilde{W}_3 N$ are the outputs of the MTI cells energized by the word-lines $W_1, W_2 \ldots W_3 N$ respectively.

The output $Y_i$ could be unstable if the input $W_i$ were at zero potential (logic state 1), but the input $W_i$ is a word-line ouput of a ternary decoder, coming from the $J_k$ arithmetic circuits 180 of FIG. 16, and the outputs of these circuits are never in logic state 1.

Figure 20:
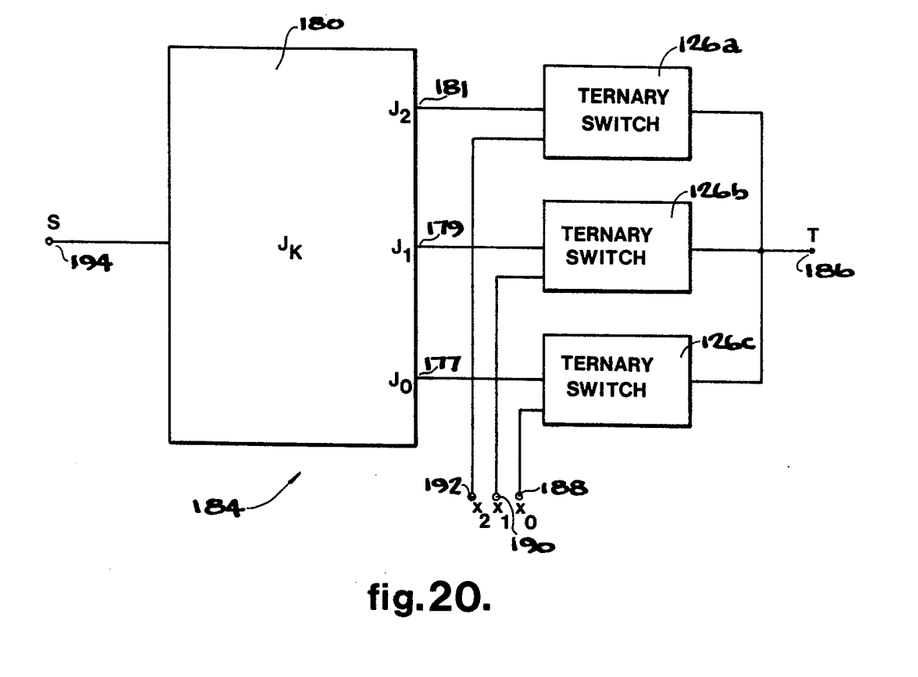

T-Gate—A T-gate 184 is shown in FIG. 20, and is a 4-input ($x_0$, $x_1$, $x_2$, S) gate whose output assumes the values of $x_0$, $x_1$ or $x_2$ according to the value of S at level 0, 1 or 2, respectively. This relationship is defined by:

$$T(x_0, x_1, x_2; S) = x_i$$

where $S = i = 0$, 1 or 2

The T-gate 184 comprises a $J_k$ arithmetic circuit 180 having outputs $J_0$, $J_1$ and $J_2$ at 177, 179 and 181 respectively; and three ternary switches 126 as described above. The output T is at 186; the inputs $x_0$, $x_1$ and $x_2$ are at 188, 190 and 192, respectively; and the S input is at 194. Obviously, if S is at logic level 2, the output 181 will be at level 2 and its ternary switch 126a will be on, while outputs 179 and 177 will be at level 0 and their ternary switches 126b and 126c will be off. The T output 186 will therefore be at the same level as input $x_2$ at 192; i.e., at logic level 0, 1 or 2.

Similarly, when S is at logic level 1, ternary switch 126b will be on and ternary switches 126a and 126c will be off. The T output at 186 will be at the level of input $x_1$, at 190; i.e., at logic level 0, 1 or 2.

Likewise, when S is at logic level 0, ternary switch 126c will be on and ternary switches 126a and 126b will be off. The T output will be at the level of input $x_0$ at 192; i.e., at logic level 0, 1 or 2.

Summary—There has been described a number of basic ternary operators and fundamental circuits, including inverters, TNOR and TNAND gates, ternary AOI circuits and modified ternary inverter circuits having complementary input. The circuits are shown to have the possibility of three levels of output, depending upon the input; so that, in any event, all of the operators can function in ternary logic having logic levels 0, 1 and 2.

For practical considerations, examples have been discussed showing the ternary logic levels 0, 1 and 2 at −4 volts, zero volts and +4 volts respectively; but those figures are chosen so as to be compatible with certain CMOS (or COS/MOS) integrated circuits which are readily and inexpensively available.

Ternary sequential circuits have been shown including such operating sequential circuits as shift registers, counters, decoders and encoders, from which it is obvious that ternary random-access-memory and ternary read-only-memory operating hardware can be derived. The use of ternary random-access-memory and ternary read-only-memory assures much greater memory density than the use of corresponding binary units; and the higher memory density—especially with relatively fast operating speeds, is believed to offset the inherent higher power dissipation which occurs because of the existence of an intermediate stable state at which time the complementary p-type and n-type elements are both conducting.

It should also be noted that the TNOR and TNAND circuits taught herein may have multiple inputs by adding additional complementary pairs of metal oxide semiconductor transistors; so that for an $m$-input TNOR gate, there would be $m$ p-type devices in series and $m$ n-type devices in parallel, with each input being connected to the respective pair of devices. Similarly, for an $m$-input TNAND gate, there would be $m$ p-type devices in parallel, and $m$ n-type devices in series, with the inputs again being appropriately connected.

It is believed that, in any event, application of ternary logic in practical considerations may be particularly well achieved using the ternary operators and fundamental circuits and the sequential circuits discussed above. Of course, modifications and amendments to circuit configurations may be made, having regard to such practical considerations as commercial feasibility and availability of complementary metal oxide semiconductors, without departing from the spirit and scope of the appended claims.

The embodiments of the invention in which an exclusive property or privilege is claimed are defined as follows:

1. A three-valued logic operator having discrete positive, zero and negative output signal values for discrete negative, zero and positive input signal values, respectively, comprising:
    an input terminal connected to the gates of a pair o complementary p-type and n-type metal oxide semiconductor devices, at least the sources of which are each respectively connected to equal and opposite power supplies of positive and negative value, respectively, and the drains of which are each connected to one of a pair of equal-valued resistors;
    said pair of equal-valued resistors having a common connection to each other at the ends of each opposite the drains of the respective p-type and n-type metal oxide semiconductor devices; and
    a first output terminal connected to the common connection of said pair of equal-valued resistors; whereby for each of said positive and negative input signal values, only one of said semiconductor devices is conductive to produce the respective output signal value; and when the input signal value is at the zero level, both of said semiconductor devices are conductive.

2. The three-valued logic operator of claim 1 where the sources and substrates of said comlementary p-type and n-type metal oxide semiconductor devices are respectively connected to said positive and negative power supplies.

3. The three-valued logic operator of claim 2 where said first output terminal is the output terminal of a simple ternary inverter; and having a second positive ternary inverter output at the connection of the drain of said p-type metal oxide semiconductor device and its respective resistor; and a third, negative ternary inverter output at the connection of the drain of said n-type metal oxide semiconductor device and its respective resistor.

4. A three-valued memory cell comprising a cross-coupled-connected pair of three-valued logic operators of claim 2;
    where the first output terminal of the first of said pair of three-valued operators is connected to the input terminal of the second of said pair of three-valued operators, and the first output terminal of the second of said pair of three-valued operators is connected to the input terminal of the first of said pair of three-valued operators.

5. A three-valued logic operator having two-entry, three-valued input and having ternary NOR output, whereby the input and output signal values have discrete positive, zero and negative levels, comprising:
    two pairs of complementary p-type and n-type metal oxide semiconductor devices, where the first and second p-type devices are connected in series and the first and second n-type devices are connected in parallel;
    a pair of input terminals, the first of which is connected to the gate of said first p-type metal oxide semiconductor device and to the gate of said second n-type metal oxide semiconductor device, the second of said input terminals being connected to the gate of said second p-type metal oxide semiconductor device and to the gate of said first n-type metal oxide semiconductor device;
    the source of said first p-type metal oxide semiconductor device being connected to a positive power supply, the source of said second p-type metal oxide semiconductor device being connected in series with the drain of said first p-type metal oxide semiconductor device; the substrates of said p-type metal oxide semiconductor devices being connected to said positive power supply; the source and substrate of each of said n-type metal oxide semiconductor devices being connected to a negative power supply;
    the drain of said second p-type metal oxide semiconductor device being connected to the first of a pair of equal-valued resistors, and the drain of each of said n-type metal oxide semiconductor devices being connected to the second of said pair of equal-valued resistors, there being a common connection of said equal-valued resistors to each other and to an output terminal.

6. The three-valued logic operator of claim 5 where said output terminal is a first output of a simple ternary NOR gate; and having a second, positive ternary NOR output at the connection of the drain of said second p-type device and said first resistor; and a third, negative ternary NOR output at the connection of the drain of said n-type devices and said second resistor.

7. A three-valued logic operator having the function of a ternary AND-OR-INVERT gate, comprising the three-valued logic operator of claim 5 together with:
    a third p-type metal oxide semiconductor device whose source and substrate are connected to said positive power supply and whose drain is connected to the drain of said second p-type metal oxide semiconductor device;

a third n-type metal oxide semiconductor device whose source and substrate are connected to said negative power supply and whose drain is connected to the source of each of said first and second n-type metal oxide semiconductor devices;

a third input terminal connected to the gates of said third p-type and n-type metal oxide semiconductor devices;

a second output terminal connected to the drains of said second and third p-type metal oxide semuconductor devices; and a third output terminal connected to the drains of said first and second n-type metal oxide semiconductor devices.

8. A three-valued logic operator having the function of a ternary AND-OR-INVERT gate, comprising the three-valued logic operator of claim 5 together with:

a third p-type metal oxide semiconductor device whose source is connected to the drain of said first p-type metal oxide semiconductor device, whose substrate is connected to said positive power supply, and whose drain is connected to the drain of said second p-type semiconductor device;

a third n-type metal oxide semiconductor device whose source and substrate are connected to said negative power supply, and whose drain is connected to the source of said second n-type metal oxide semiconductor device, the source of said first n-type metal oxide semiconductor device being connected to said negative power supply;

a third input terminal connected to the gates of said third p-type and n-type metal oxide semiconductor devices;

a second output terminal connected to the drains of said second and third p-type metal oxide semiconductor devices; and a third output terminal connected to the drains of said first and second n-type metal oxide semiconductor devices.

9. A three-valued logic operator having two-entry, three-valued input and having ternary NAND ouput, whereby the input and output signal values have discrete positive, zero and negative levels, comprising:

two pairs of complementary p-type and n-type metal oxide semiconductor devices, where the first and second p-type devices are connected in parallel and the first and second n-type devices are connected in series; a pair of input terminals, the first of which is connected to the gate of the first n-type metal oxide semiconductor device and to the gate of the first p-type metal oxide semiconductor device, the second of said input terminals being connected to the gate of said second n-type metal oxide semiconductor device and to the gate of said second p-type metal oxide semiconductor device;

the source of said second n-type metal oxide semiconductor device being connected to a negative power supply, and the source of said first n-type metal oxide semiconductor device being connected in series with the drain of said second n-type metal oxide semiconductor device; the substrates of said n-type metal oxide semiconductor devices being connected to said negative DC power supply; the source and substrate of each of said p-type metal oxide semiconductor devices being connected to a positive power supply;

the drains of each of said first and second p-type metal oxide semiconductor devices being connected to the first of a pair of equal-valued resistors, and the drain of said first n-type metal oxide semiconductor device being connected to the second of said pair of equal-valued resistors, there being a common connection of said equal-valued resistors to each other and to an output terminal.

10. The three-valued logic operator of claim 9 where said output terminal is a first output of a simple ternary NAND gate; and having a second, positive ternary NAND output at the connection of the drains of said p-type devices and said first resistor; and a third, negative ternary NAND output at the connection of said first n-type device and said second resistor.

11. A three-valued logic operator having the function of a ternary AND-OR-INVERT gate, comprising the three-valued logic operator of claim 9 together with:

a third p-type metal oxide semiconductor device whose source and substrate are connected to said positive power supply and whose drain is connected to the source of said first p-type metal oxide semiconductor device;

a third n-type metal oxide semiconductor device whose source is connected to the drain of said second n-type metal oxide semiconductor device, whose substrate is connected to said negative power source, and whose drain is connected to the drain of said first n-type metal semiconductor device;

a third input terminal connected to the gates of said third p-type and n-type metal oxide semiconductor devices;

a second output terminal connected to the drains of said first and second p-type metal oxide semiconductor devices; and a third output terminal connected to the drains of said first and third n-type metal oxide semiconductor devices.

12. A three-valued logic operator having the function of a ternary AND-OR-INVERT gate, comprising the three-valued logic operator of claim 9 together with:

a third p-type metal oxide semiconductor device whose source and substrate are connected to said positive power supply and whose drain is connected to the sources of said first and second p-type metal oxide semiconductor devices;

a third n-type metal oxide semiconductor device whose source and substrate are connected to said negative power supply and whose drain is connected to the drain of said first n-type metal oxide semiconductor device;

a third input terminal connected to the gates of said third p-type and n-type metal oxide semiconductor devices;

a second output terminal connected to the drains of said first and second p-type metal oxide semiconductor devices; and a third output terminal connected to the drains of said first and third n-type metal oxide semiconductor devices.

* * * * *

UNITED STATES PATENT OFFICE
CERTIFICATE OF CORRECTION

Patent No. 4,107,549            Dated August 15, 1978

Inventor(s) Hussein T. Mouftah

It is certified that error appears in the above-identified patent and that said Letters Patent are hereby corrected as shown below:

On the title page, item (76) "Hussein T. Moufah" should read

-- Hussein T. Mouftah --.

Signed and Sealed this

*Twentieth* Day of *February 1979*

[SEAL]

*Attest:*

RUTH C. MASON
*Attesting Officer*

DONALD W. BANNER
*Commissioner of Patents and Trademarks*